United States Patent
Tsai et al.

(10) Patent No.: US 9,018,757 B2
(45) Date of Patent: Apr. 28, 2015

(54) MECHANISMS FOR FORMING BUMP STRUCTURES OVER WIDE METAL PAD

(71) Applicant: Taiwan Semiconductor Manufacturing Co., Ltd., Hsin-Chu (TW)

(72) Inventors: Chung-Hao Tsai, Huatan Township (TW); Chuei-Tang Wang, Taichung (TW); Chen-Hua Yu, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/943,256

(22) Filed: Jul. 16, 2013

(65) Prior Publication Data
US 2015/0021758 A1    Jan. 22, 2015

(51) Int. Cl.
*H01L 23/48*    (2006.01)
*H01L 23/498*    (2006.01)

(52) U.S. Cl.
CPC ................ *H01L 23/49811* (2013.01)

(58) Field of Classification Search
CPC ............... H01L 23/3171; H01L 24/02; H01L 2224/023
USPC ................... 438/665; 257/772, 684
See application file for complete search history.

(56) References Cited

U.S. PATENT DOCUMENTS

| | | | |
|---|---|---|---|
| 6,255,737 B1 * | 7/2001 | Hashimoto | 257/784 |
| 7,309,924 B2 | 12/2007 | Song et al. | |
| 2002/0079575 A1 * | 6/2002 | Hozoji et al. | 257/734 |
| 2004/0246692 A1 * | 12/2004 | Satoh et al. | 361/782 |
| 2005/0020052 A1 * | 1/2005 | Lee et al. | 438/613 |
| 2005/0146030 A1 * | 7/2005 | Miyazaki | 257/738 |
| 2007/0164441 A1 * | 7/2007 | Lee et al. | 257/762 |
| 2007/0290343 A1 * | 12/2007 | Harada et al. | 257/737 |
| 2009/0256257 A1 * | 10/2009 | Daubenspeck et al. | 257/738 |

\* cited by examiner

*Primary Examiner* — Caridad Everhart
(74) *Attorney, Agent, or Firm* — Birch, Stewart, Kolasch & Birch, LLP

(57) ABSTRACT

Embodiments of mechanisms for forming a semiconductor die are provided. The semiconductor die includes a semiconductor substrate and a protection layer formed over the semiconductor substrate. The semiconductor die also includes a conductive layer conformally formed over the protection layer, and a recess is formed in the conductive layer. The recess surrounds a region of the conductive layer. The semiconductor die further includes a solder bump formed over the region of the conductive layer surrounded by the recess.

20 Claims, 17 Drawing Sheets

MECHANISMS FOR FORMING BUMP STRUCTURES OVER WIDE METAL PAD

BACKGROUND

Semiconductor devices are used in a variety of electronic applications, such as personal computers, cell phones, digital cameras, or other electronic equipment. The semiconductor devices are typically fabricated by sequentially depositing insulating or dielectric layers, conductive layers, and semiconductor layers over a semiconductor substrate, and patterning the various material layers using lithography and etching processes to form circuit components and elements on the semiconductor substrate.

The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller package that utilizes less area or smaller heights, in some applications.

New packaging technologies have been developed to improve the density and functions of semiconductor devices. These relatively new types of packaging technologies for semiconductor devices face manufacturing challenges.

BRIEF DESCRIPTION OF THE DRAWINGS

For a more complete understanding of the embodiments, and the advantages thereof, reference is now made to the following descriptions taken in conjunction with the accompany drawings, in which.

DETAILED DESCRIPTION OF THE ILLUSTRATIVE EMBODIMENTS

The making and using of the embodiments of the disclosure are discussed in detail below. It should be appreciated, however, that the embodiments can be embodied in a wide variety of specific contexts. The specific embodiments discussed are merely illustrative, and do not limit the scope of the disclosure.

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows include embodiments in which the first and second features are formed in direct contact, and may also include embodiments in which additional features may be formed between the first and second features, such that the first and second features may not be in direct contact.

Some variations of the embodiments are described. Throughout the various views and illustrative embodiments, like reference numbers are used to designate like elements.

Figure 1A:
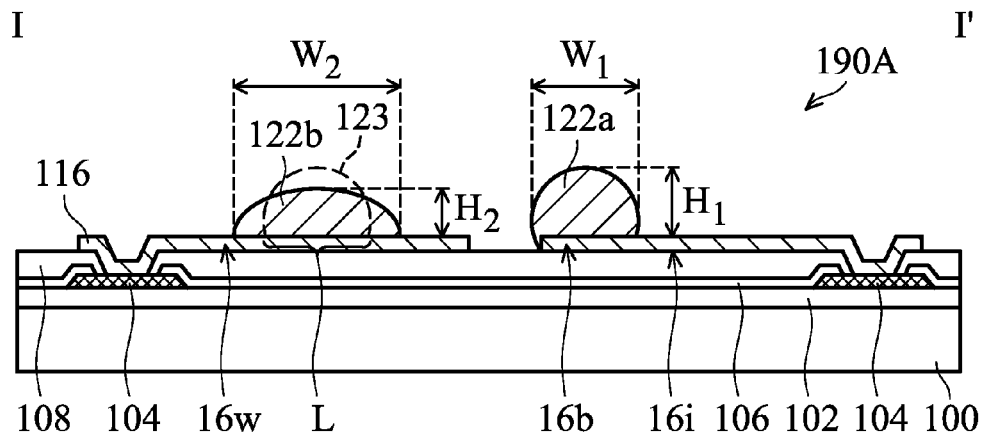
FIGS. 1A and 1B are respectively a cross-sectional view of a semiconductor die and a top view of the semiconductor die before solder bumps are formed, in accordance with some embodiments.
Figure 1B:
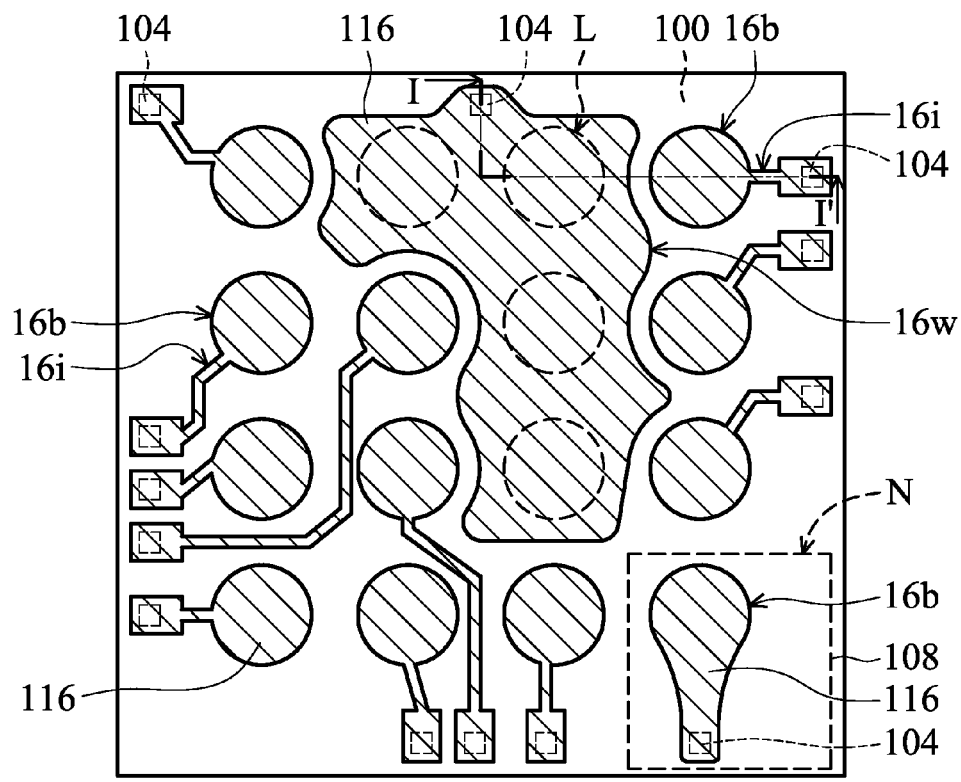

FIGS. 1A and 1B are respectively a cross-sectional view of a semiconductor die 190A and a top view of semiconductor die 190A before solder bumps 122a and 122b are formed, in accordance with some embodiments. FIG. 1A is a cross-sectional view of a portion of semiconductor die 190A along a sectional line I-I' shown in FIG. 1B after solder bumps are formed. In some embodiments, the component 190A is a die package.

As shown in FIGS. 1A and 1B, a semiconductor substrate 100 is provided. In some embodiments, device elements are formed in and/or on semiconductor substrate 100. Semiconductor substrate 100 is defined to mean any construction including semiconductor materials. Semiconductor substrate 100 includes a bulk silicon substrate, a portion of a semiconductor wafer, a silicon-on-insulator (SOI) substrate, or a silicon germanium substrate. Other semiconductor materials including group III, group IV, and group V elements may also be used.

Semiconductor substrate 100 may further include isolation features (not shown), such as shallow trench isolation (STI) features or local oxidation of silicon (LOCOS) features. The isolation features may define and isolate various device elements.

Examples of the various device elements, that may be formed in semiconductor substrate 100, include transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.), diodes, other applicable elements, or combinations thereof.

As shown in FIG. 1A, an interconnection structure 102 is formed over semiconductor substrate 100, in accordance with some embodiments. Interconnection structure 102 includes dielectric layers and metal layers. Contact pads 104 are formed over interconnection structure 102 on semiconductor substrate 100, as shown in FIGS. 1A and 1B. The metal layers of interconnection structure 102 provide electrical connections between the various device elements formed in semiconductor substrate 100 and contact pads 104. Contact pads 104 may be made of aluminum, copper, gold, platinum, another applicable material, or combinations thereof. Interconnect structure 102 and contact pads 104 may be formed by various deposition and patterning processes.

As shown in FIG. 1A, a first passivation layer 106 is deposited and patterned over interconnection structure 102 and contact pads 104, in accordance with some embodiments. First passivation layer 106 is patterned to have openings that expose contact pads 104. First passivation layer 106 may be made of silicon oxide, silicon nitride, silicon oxynitride, another applicable material, or combinations thereof. First passivation layer 106 may be deposited by using a CVD process, and then patterned by using a photolithography process and an etching process.

As shown in FIG. 1A, a second passivation layer 108 (protection layer) is then deposited and patterned over first passivation layer 106 and pads 104, in accordance with some embodiments. Second passivation layer 108 is patterned to have openings that expose contact pads 104. Second passivation layer 108 may be made of a dielectric material, such as a polymer material. The polymer material may include polybenzoxazole (PBO), epoxy, polyimide, another suitable material, or combinations thereof. In some embodiments, second passivation layer 108 is deposited by using a spin-on process and patterned by a photolithography process. Conductive layer 116 is deposited and patterned over second passivation layer 108 and contact pads 104, in accordance with some embodiments.

Conductive layer 116 may also be referred as a post-passivation interconnect (PPI) layer. Conductive layer 116 is used to provide electrical connections between contact pads 104 and solder bumps, such as solder bumps 122a and 122b. Conductive layer 116 may be made of Cu, Al, Au, Pt, Ti, another applicable material, or combinations thereof. Conductive layer 116 may be deposited by using a plating process, PVD process, CVD process, another applicable process, and then patterned by using a photolithography process and an etching process.

The pattern of conductive layer 116 includes any desired pattern. For example, conductive layer 116 has the pattern as shown in FIG. 1B. Conductive layer 116 may have multiple sections, which may be electrically insulated from each other.

As shown in FIG. 1B, each of the sections may have an interconnection portion 16i and a ball pad portion 16b. Interconnection portion 16i is used to electrically connect ball pad portion 16b to a corresponding one of contact pads 104. Ball pad portion 16b is used to define a position of the solder bump to be formed.

The sections of conductive layer 116 may also include a wide pad portion 16w, which may be used for power and/or ground. The area of wide pad portion 16w is several times of that of ball pad portion 16b. Therefore, it needs to form multiple solder bumps on wide pad portion 16w. The multiple solder bumps together support semiconductor substrate 100 during a subsequent bonding process. For example, semiconductor die 190A is bonded to another package (such as a die package) or substrate (such as a PCB board or a board).

Solder bumps 122a and 122b are formed on conductive layer 116, in accordance with some embodiments. Solder bump 122a is formed on one of ball pad portions 16b. During the reflow process for forming solder bumps 122a and 122b, the solder material for forming solder bump 122a is confined on ball pad portion 16b of conductive layer 116. Solder bump 122a is therefore formed on desired position and has desired configuration. In some embodiments, solder bump 122a covers an edge of ball pad portion 16b of conductive layer 116, as shown in FIG. 1A.

However, the solder material on wide pad portion 16w is relatively free to move, compared to that on ball pad portion 16b during the reflow process. In some embodiments, it is originally intended to form solder bump 122b on location L of wide pad portion 16w. Because the solder material is relatively free to move on wide pad portion 16w, the solder material on wide pad portion 16w may spread out from location L. As a result, solder bump 122b is not precisely formed on location L and has a wider and shorter configuration than the intended configuration (shown as dotted line 123 in FIG. 1A).

Solder bump 122b may have a height $H_2$, which is less than height $H_1$ of solder bump 122a. As a result, when semiconductor die 190A is bonded to another element (such as a substrate or a package), solder bump 122b may be unable to be bonded to the element. Solder bump 122b may have a width $W_2$, which is larger than width $W_1$ of solder bump 122a. As a result, during the reflow process, solder bump 122b may be shorted with adjacent bumps.

To reduce or resolve the problems mentioned above, a recess is formed on the conductive layer to assist in confining the position and configuration of the solder bump, in accordance with some embodiments.

FIGS. 2A-2I are cross-sectional views of various stages of a process for forming a semiconductor die 190B, in accordance with some embodiments. In some embodiments, the component 190B is a die package.

Figure 2A:
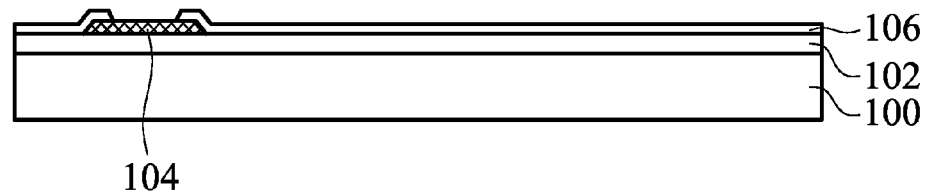
FIGS. 2A-2I are cross-sectional views of various stages of a process for forming a semiconductor die, in accordance with some embodiments.
Figure 2B:
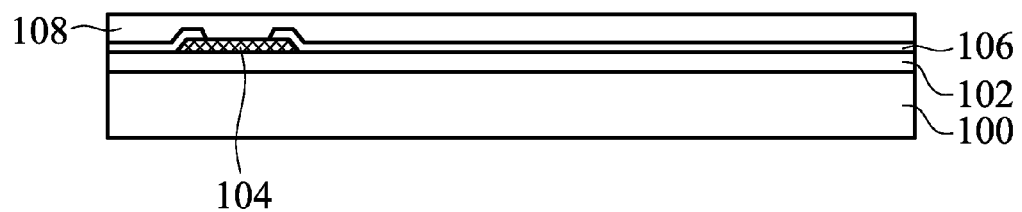

As shown in FIG. 2A, interconnection structure 102, contact pad 104, and first passivation layer 106 are formed over semiconductor substrate 100, in accordance with some embodiments. Materials and fabrication methods of these elements have been described above. Afterwards, second passivation layer 108 is deposited over first passivation layer 106 and contact pads 104, as shown in FIG. 2B.

Figure 2C:
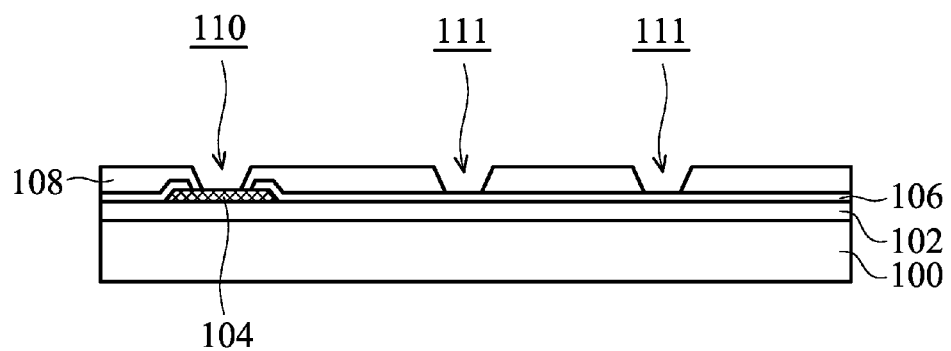

As shown in FIG. 2C, second passivation layer 108 is patterned to form a hole 110 and recess opening(s) 111 in second passivation layer 108, in accordance with some embodiments. Hole 110 exposes contact pad 104. Recess opening 111 exposes first passivation layer 106. In some embodiments, recess opening 111 is ring-shaped. Recess opening 111 may be circular ring-shaped, square ring-shaped, rectangular ring-shaped, or having another suitable shape. Therefore, the two hole-like depressions (labeled with "111") shown in FIG. 2C are actually connected with each other. The two hole-like depressions are portions of the same ring-shaped recess.

Although recess opening 111 shown in FIG. 2C exposes first passivation layer 106, embodiments of the disclosure are not limited thereto. In some other embodiments, recess opening 111 extends from an upper surface of second passivation layer 108 without completely penetrating through protection layer. First passivation layer 106 is thus not exposed by recess opening 111.

Afterwards, a conductive layer is formed over second passivation layer 108 and contact pad 104. As mentioned above, the conductive layer may be formed by using a variety of processes. In the following description, an electroplating process is taken as an example for illustration.

Figure 2D:
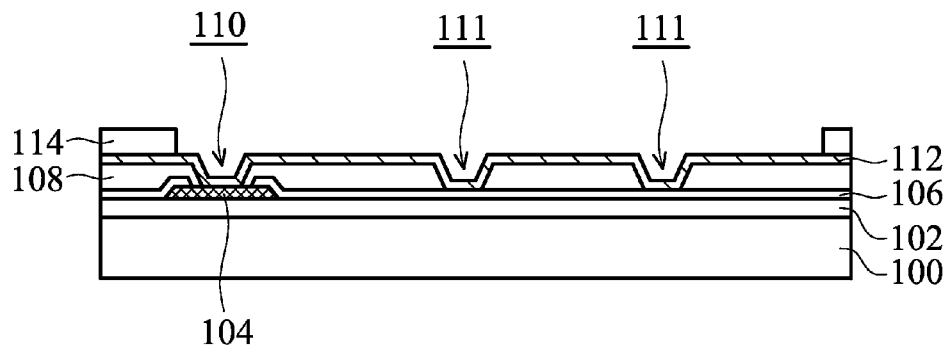

As shown in FIG. 2D, a seed layer 112 is deposited over second passivation layer 108 and contact pad 104. In some embodiments, seed layer 112 is made of Cu or Cu alloy. Other conductive materials may be used, such as Au. In some embodiments, a barrier layer (not shown) is under seed layer 112 and sandwiched between seed layer 112 and second passivation layer 108 or first passivation layer 106. In some embodiments, the barrier layer is made of Ti or Ti alloy. Seed layer 112 and the barrier layer may function as a UBM layer. The barrier layer and seed layer 112 may be sequentially deposited by using a PVD process or another applicable process.

Afterwards, a mask layer 114 is deposited and patterned over seed layer 112, in accordance with some embodiments. Mask layer 114 may include a photoresist layer. Mask layer 114 is patterned to have multiple openings, which correspond to a desired pattern of the conductive layer intended to be formed. As shown in FIG. 2D, seed layer 112, exposed by one of the openings of mask layer 114, defines a portion of the pattern of the conductive layer. Seed layer 112 exposed may have a top view similar to that of conductive layer 116 shown in FIG. 1B. However, it should be noted that the pattern is variable according to requirements.

Figure 2E:
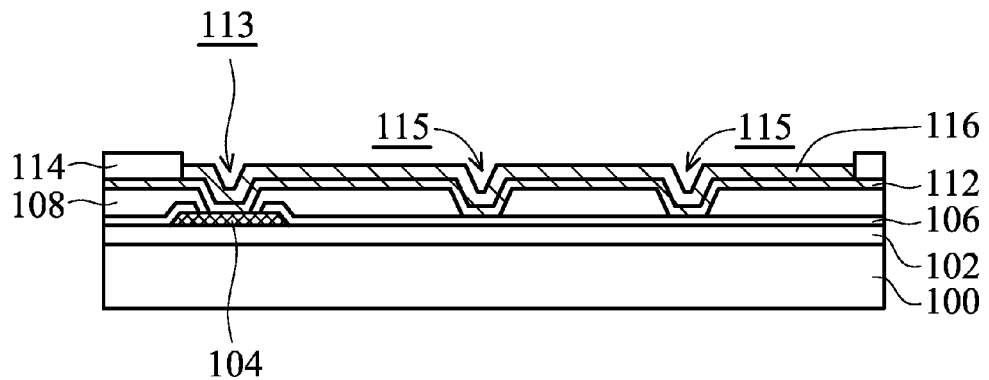

As shown in FIG. 2E, conductive layer 116 is deposited over seed layer 112, which is exposed, by using an electroplating process, in accordance with some embodiments. In some embodiments, conductive layer 116 is made of Cu or Cu alloy. Other conductive materials may be used. During the electroplating process, no metal material is deposited on seed layer 112 which is covered by mask layer 114.

In some embodiments, conductive layer 116 is conformally formed over seed layer 112. Seed layer 112 is also conformally formed over second passivation layer 108. By tuning the surface profile of second passivation layer 108, the surface profile of conductive layer 116 is also accordingly tuned. In some embodiments, conductive layer 116 has an opening 113 and recess(es) 115.

Figure 2F:
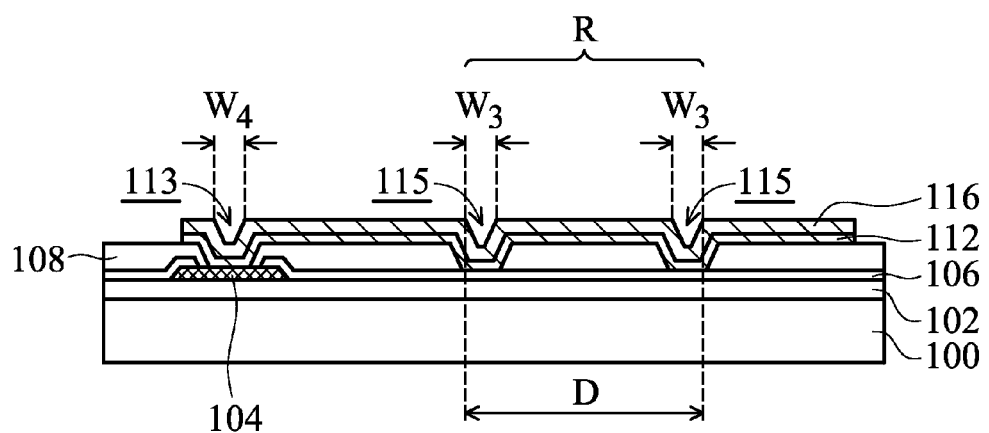

As shown in FIG. 2F, mask layer 114 and a portion of seed layer 112, which is under mask layer 114, are sequentially removed. After mask layer 114 is removed, an etching process may be performed to remove seed layer 112 which is exposed. An upper portion of conductive layer 116 may also be removed during the etching process for removing the portion of seed layer 112 which is originally under mask layer 114. Conductive layer 116, having the desired pattern, is therefore formed, as shown in FIG. 2F.

Figure 3:
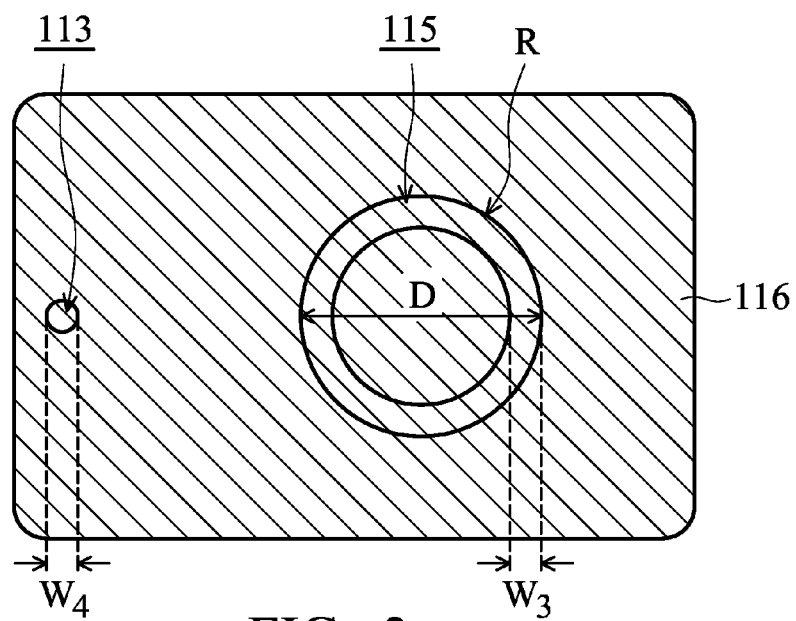
FIG. 3 is a top view of a conductive layer of the semiconductor die, in accordance with some embodiments.

FIG. 3 is a top view of conductive layer 116 shown in FIG. 2F, in accordance with some embodiments. As shown in FIG. 3, recess 115 is a circular ring-shaped recess. The outer edge of recess 115 surrounds a region R of conductive layer 116, where a solder bump is to be formed. A width $W_3$ of recess 115 may be in a range from about 5 μm to about 40 μm. A diameter D of region R may be in a range from about 100 μm to about 300 μm. A ratio of width $W_3$ to diameter D may be in a range from about 1.6% to about 40%. In addition, a width $W_4$ of opening 113 may be in a range from about 5 μm to about 30 μm. In some embodiments, recess 115 is circular ring-shaped, square ring-shaped, rectangular ring-shaped, or having another suitable shape.

Figure 2G:
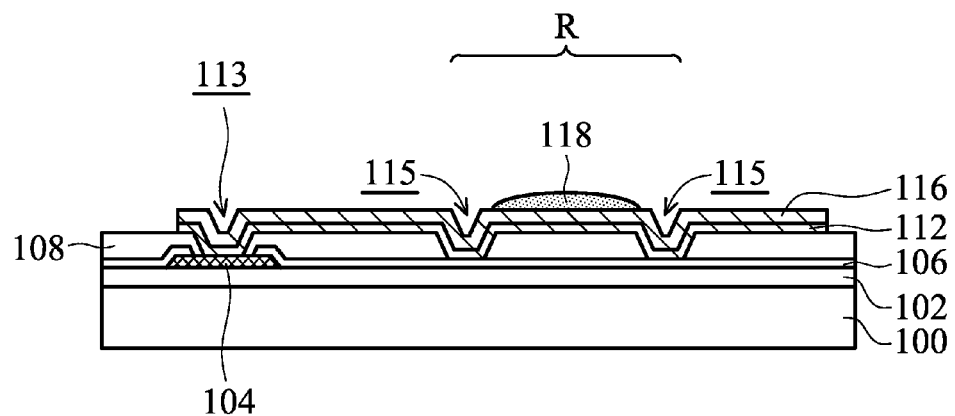

As shown in FIG. 2G, flux 118 is applied over conductive layer 116, in accordance with some embodiments. Flux 118 is applied over region R surrounded by recess 115 (i.e., a ring-shaped recess). Due to the existence of recess 115, flux 118 is confined to be within region R. Even if too much of flux 118 is applied, recess 115 contains the excess portion of flux 118. Flux 118 is prevented from extending across region R.

Figure 2H:
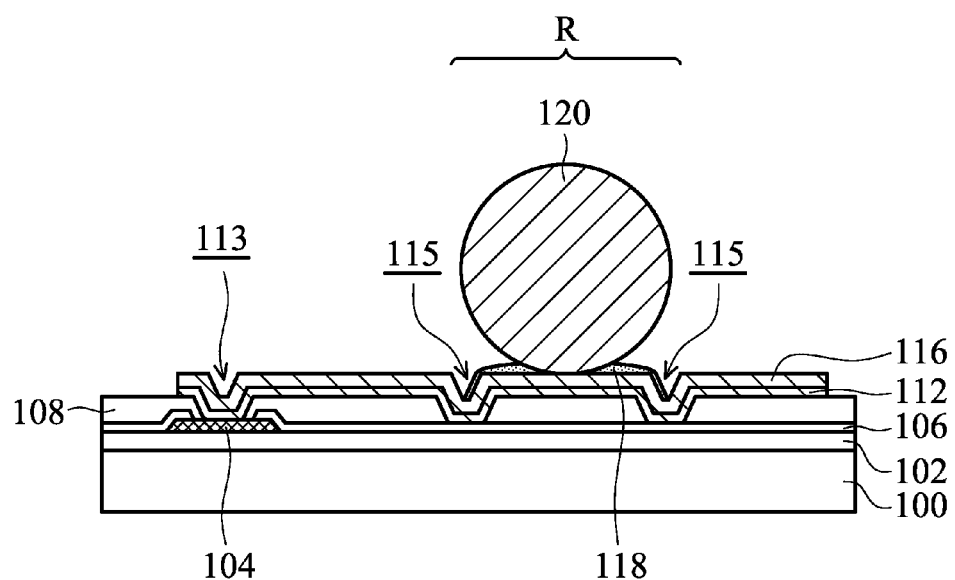

As shown in FIG. 2H, a solder ball 120 is placed on flux 118, in accordance with some embodiments. Solder ball 120 adheres to conductive layer 116 by flux 118 and is positioned at the desired location (over region R). Solder ball 120 may include lead or be lead free. In some embodiments, flux 118 flows into recess 115 after solder ball 120 is placed. Due to recess 115, flux 118 is substantially confined at the same position (region R). Solder ball 120 is therefore positioned over region R without shifting.

Figure 2I:
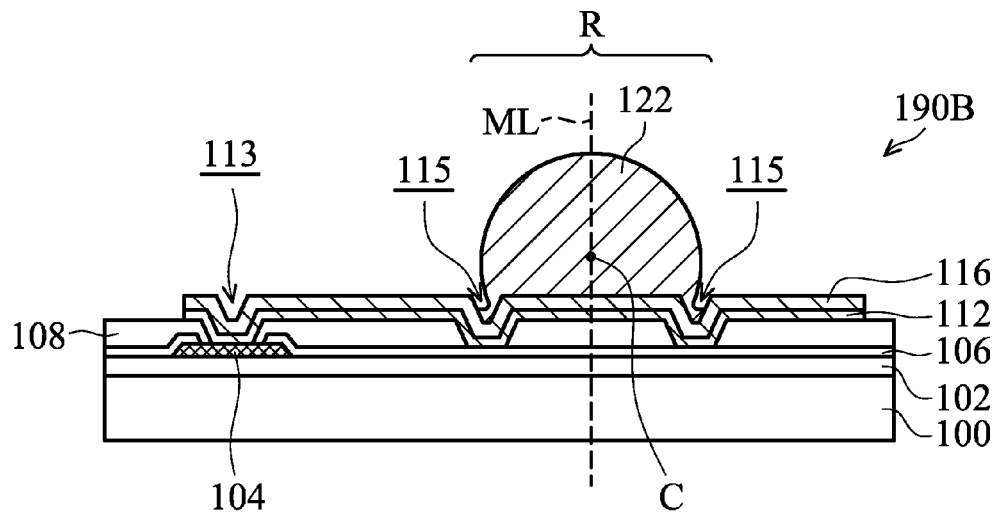

As shown in FIG. 2I, a reflow process is performed to form solder bump 122, in accordance with some embodiments. During the reflow process, flux 118 is evaporated and solder ball 120 is melt and reflowed to be solder bump 122. Due to recess 115, the solder material coming from solder ball 120 is confined within region R surrounded by recess 115. The position of solder bump 122 is prevented from spreading out and shifting away from region R. Therefore, a desired configuration is achieved when forming solder bump 122 since the solder material is confined. The width, the height, the position, and the shape of solder bump 122 are precisely controlled.

In some other embodiments, solder material may completely fill recess 115 and extend across region R. The most portion of the solder material is limited to be in region R, and a rest portion of the solder material extends slightly over region R. The solder material is still limited to be over region R. As a result, the width, the height, the position, and the shape of solder bump 122 are still precisely controlled.

As shown in FIG. 2I, a portion of second passivation layer 108 is right under a central point C of solder bump 122, in accordance with some embodiments. A vertical line ML, penetrating through central point C of solder bump 122 and substantially perpendicular to a top surface of semiconductor substrate 100, also penetrates through second passivation layer 108. Second passivation layer 108 is sandwiched between central point C of solder bump 122 and semiconductor substrate 100 along vertical line ML. Because second passivation layer 108 is elastic and soft, second passivation layer 108 may reduce the stress applied on semiconductor substrate 100 right under solder bump 122. Crack risk of semiconductor substrate 100 is significantly reduced.

Figure 4A:
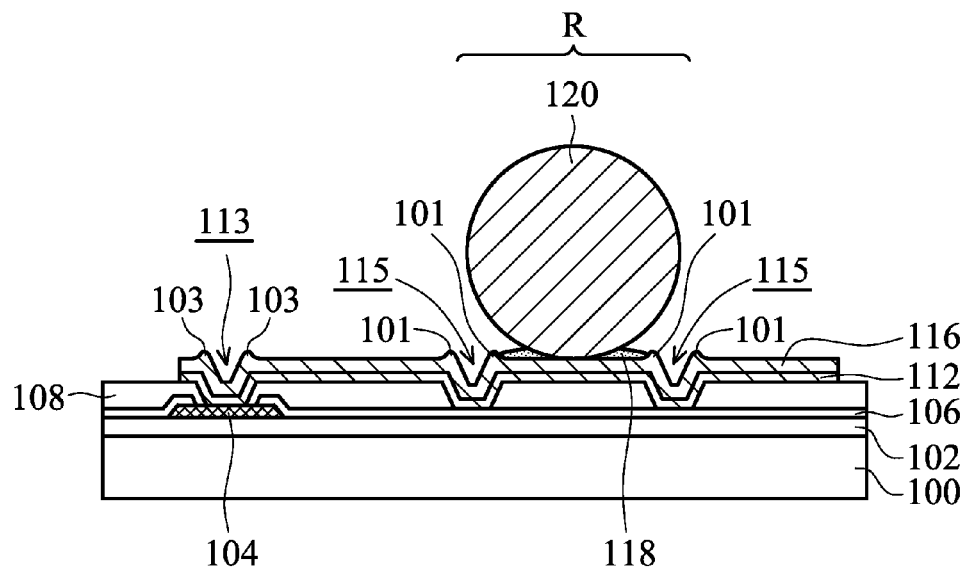
FIGS. 4A and 4B are cross-sectional views of stages of a process for forming a semiconductor die, in accordance with some embodiments.
Figure 4B:
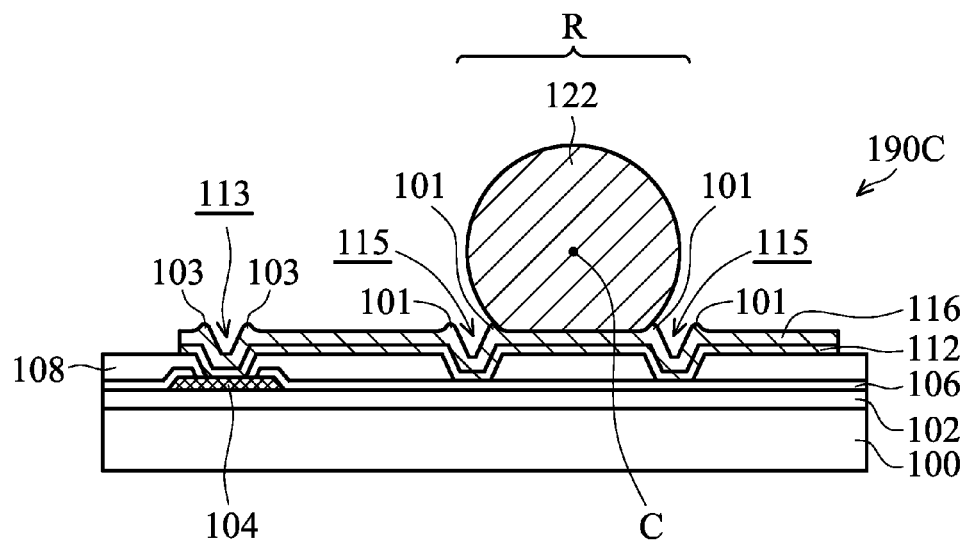

Embodiments of the disclosure have many variations. Some of the variations are described in the following descriptions. FIGS. 4A and 4B are cross-sectional views of stages of a process for forming a semiconductor die 190C, in accordance with some embodiments. As shown in FIG. 4A, conductive layer 116 has raised structures 101 at the edge of recess 115, in accordance with some embodiments. Therefore, flux 118 is more confined by raised structures 101 to prevent flux 118 from flowing into recess 115. In some embodiments, conductive layer 116 further has raised structures 103 on the edge of opening 113.

As shown in FIG. 4B, a reflow process is then performed to form solder bump 122, in accordance with some embodiments. During the reflow process, flux 118 is evaporated and solder ball 120 is melt and reflowed to be solder bump 122. Due to raised structures 101, the solder material coming from solder ball 120 is confined within region R surrounded by raised structures 101 and recess 115. In some embodiments, solder bump 122 does not extend into recess 115.

Figure 4C:
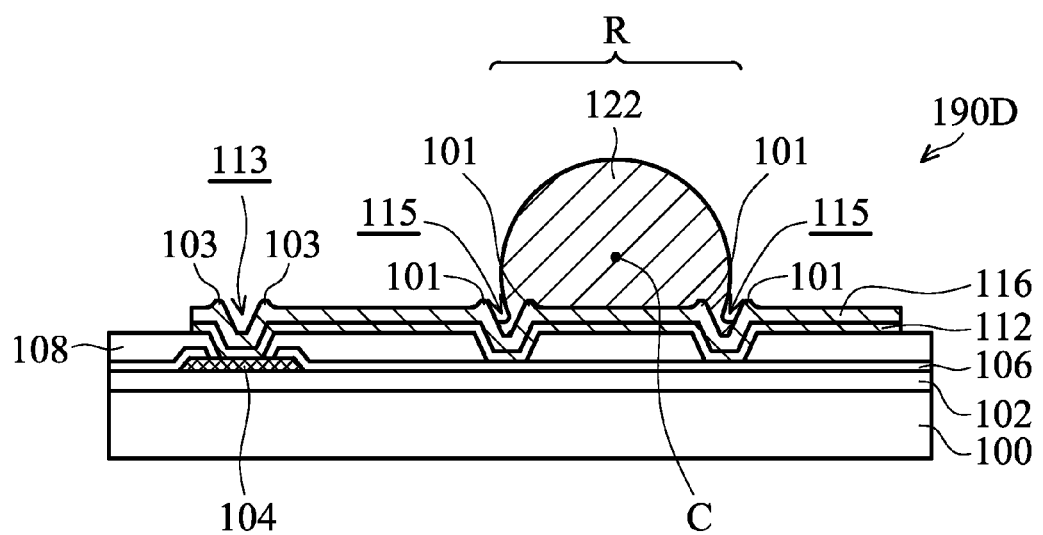
FIG. 4C is a cross-sectional view of a semiconductor die, in accordance with some embodiments.

FIG. 4C is a cross-sectional view of a semiconductor die 190D, in accordance with some embodiments. As shown in FIG. 4C, a portion of solder bump 122 may extend across raised structures 101 and fill recess 115.

Figure 5A:
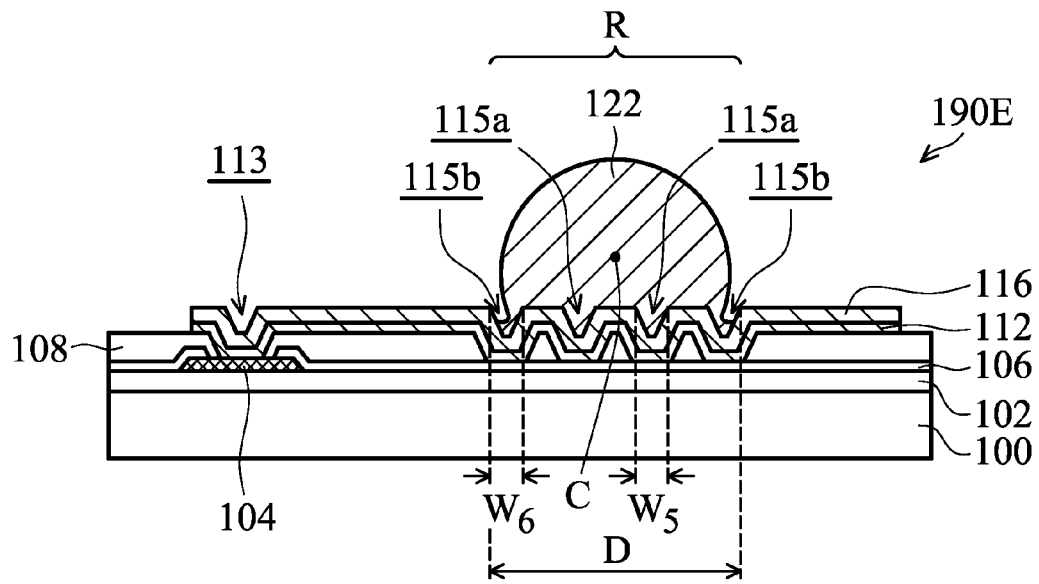
FIGS. 5A and 5B are respectively a cross-sectional view of a semiconductor die and a top view of a conductive layer of the semiconductor die, in accordance with some embodiments.
Figure 5B:
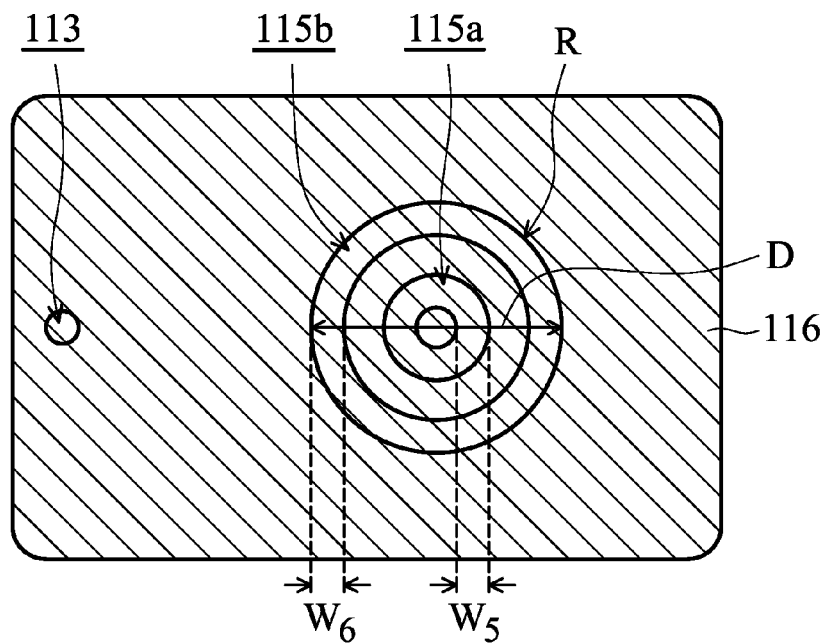

FIGS. 5A and 5B are respectively a cross-sectional view of a semiconductor die 190E and a top view of conductive layer 116 of semiconductor die 190E, in accordance with some embodiments. As shown in FIGS. 5A and 5B, multiple recesses, including recesses 115a and 115b, are used to confine the position and configuration of solder bump 122. Recesses 115a and 115b may be ring-shaped recesses. The ring-shaped recesses may be circular, square, rectangular, or having other suitable shapes.

In some embodiments, recesses 115a and 115b are formed after conductive layer 116 is conformally formed over second passivation layer 108. Recesses 115a and 115b are therefore simultaneously formed. Second passivation layer 108 is patterned to have recess openings corresponding to recesses 115a and 115b. For example, second passivation layer 108 has a ring-shaped recess opening.

In some embodiments, the outer edge of recess 115b surrounds region R, and recess 115a surrounds a region smaller than region R. The solder material for forming solder bump 122 may completely fill recess 115a and extends into recess 115b. Solder bump 122 extends over more than one recesses formed in conductive layer 116.

Recess 115b further ensures that the solder material is within region R. As a result, solder bump 122 is confined within region R. Solder bump 122, located over the desired position and having the desired configuration, is therefore achieved. In some embodiments, second passivation layer 108, which is elastic and soft, is right under central point C of solder bump 122 to support solder bump 122. Due to second passivation layer 108 right under solder bump 122, semiconductor substrate 100 is prevented from being damaged.

In some embodiments, a width $W_5$ of recess 115a is the same as a width $W_6$ of recess 115b. In some embodiments, width $W_5$ of recess 115a is different from width $W_6$ of recess 115b. Width $W_5$ of recess 115a may be in a range from about 5 μm to about 40 μm. Width $W_6$ of recess 115b may be in a range from about 5 μm to about 40 μm. A diameter D of region R may be in a range from about 100 μm to about 300 μm. A ratio of width $W_5$ to diameter D may be in a range from 1.6% to 40%. A ratio of width $W_6$ to diameter D may be in a range from 1.6% to 40%.

Figure 6A:
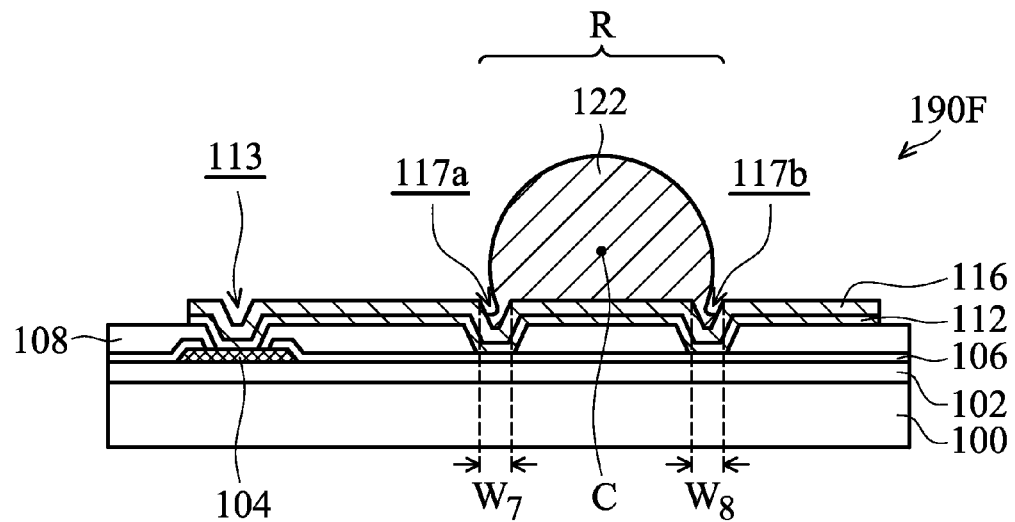
FIGS. 6A and 6B are respectively a cross-sectional view of a semiconductor die and a top view of a conductive layer of the semiconductor die, in accordance with some embodiments.
Figure 6B:
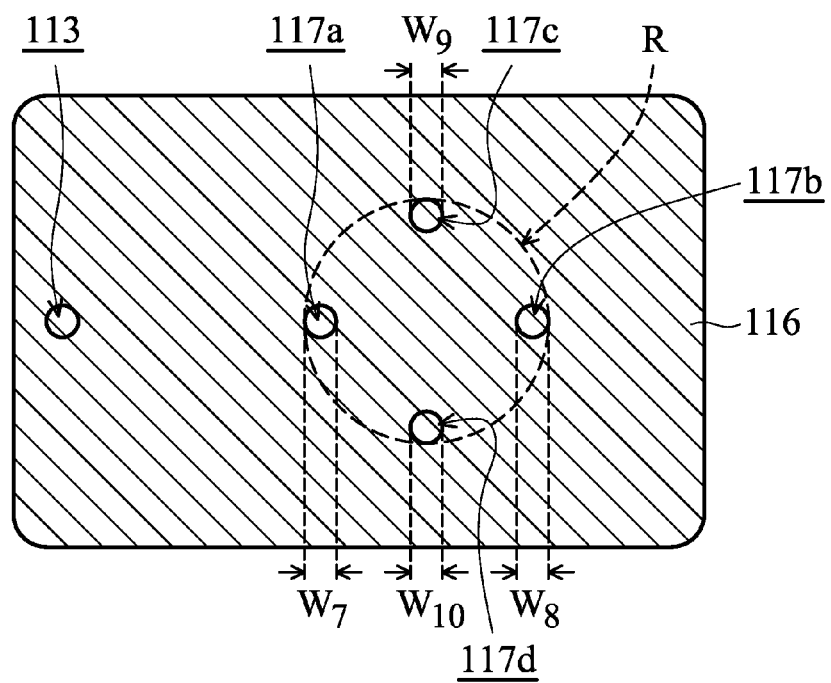

FIGS. 6A and 6B are respectively a cross-sectional view of a semiconductor die 190F and a top view of conductive layer 116 of semiconductor die 190F, in accordance with some embodiments. Conductive layer 116 may has multiple recesses including recesses 117a, 117b, 117c, and 117d arranged in a circle. Recesses 117a, 117b, 117c, and 117d are not limited to be ring-shaped recesses. As shown in FIG. 6A, recesses 117a, 117b, 117c, and 117d are openings, which are formed in conductive layer 116 without penetrating through conductive layer 116. The shapes of recesses 117a, 117b, 117c, and 117d may include circle, rectangle, square, or another suitable shape. The number of recesses is not limited to be four. In some other embodiments, more or less recesses are used.

In some embodiments, recesses 117a, 117b, 117c, and 117d surround region R and are also capable of confining the solder material for forming solder bump 122. The position and the configuration of solder bump 122 are also precisely controlled. As shown in FIG. 6A, second passivation layer 108 is right under central point C of solder bump 122 to support solder bump 122. Semiconductor substrate 100 right under solder bump 122 is therefore protected.

Recesses 117a, 117b, 117c, and 117d have widths $W_7$, $W_8$, $W_9$ and $W_{10}$, respectively. In some embodiments, widths $W_7$, $W_8$, $W_9$ and $W_{10}$ are the same. In some embodiments, some or all of widths $W_7$, $W_8$, $W_9$ and $W_{10}$ are different from each other.

Figure 6C:
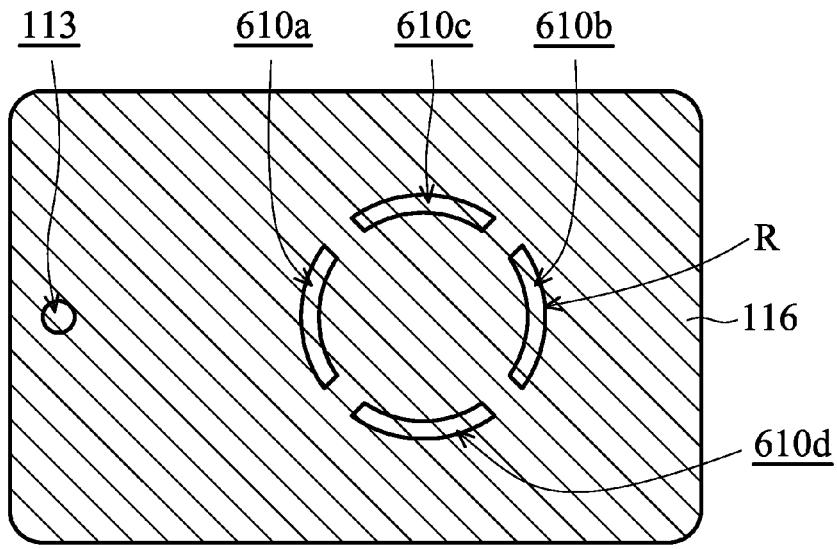
FIG. 6C is a top view of a conductive layer of a semiconductor die, in accordance with some embodiments.

FIG. 6C is a top view of conductive layer 116 of a semiconductor die, in accordance with some embodiments. As shown in FIG. 6C, conductive layer 116 has recesses 610a, 610b, 610c, and 610d arranged in a circle. Recesses 610a, 610b, 610c, and 610d are arc-shaped and are separated from each other, in accordance with some embodiments. Recesses 610a, 610b, 610c, and 610d surround region R and are also capable of confining the solder material for forming a solder bump. The position and the configuration of the solder bump are also precisely controlled. It should be noted that the number of the mentioned recesses is not limited to four. The number of the recesses may be two, three, five, or six.

Figure 6D:
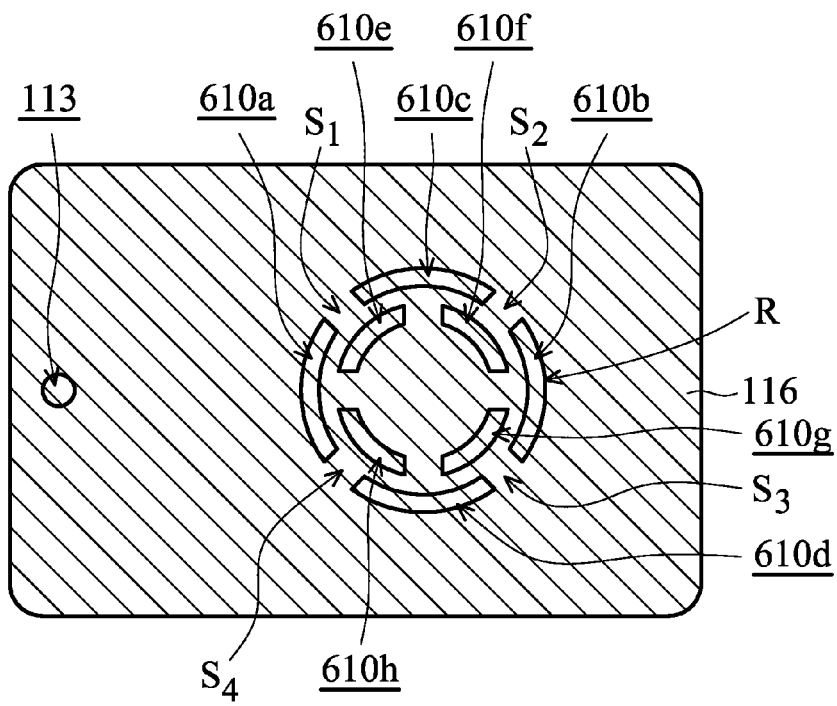
FIG. 6D is a top view of a conductive layer of a semiconductor die, in accordance with some embodiments.

FIG. 6D is a top view of conductive layer 116 of a semiconductor die, in accordance with some embodiments. As shown in FIG. 6D, in some embodiments, conductive layer 116 has recesses 610a, 610b, 610c and 610d arranged in a circle. In addition, conductive layer 116 further has recesses 610e, 610f, 610g and 610h arranged in another circle, which is surrounded by recesses 610a, 610b, 610c and 610d.

Recesses 610e, 610f, 610g and 610h are arc-shaped and are separated from each other, in accordance with some embodiments. Recess 610e is adjacent to the space $S_1$ between recesses 610a and 610c. Recess 610f is adjacent to the space $S_2$ between recesses 610b and 610c. Recess 610g is adjacent to the space $S_3$ between recesses 610b and 610d. Recess 610h is adjacent to the space $S_4$ between recesses 610a and 610d. These recesses are capable of confining the solder material for forming a solder bump. The position and the configuration of the solder bump are also precisely controlled.

Figure 7A:
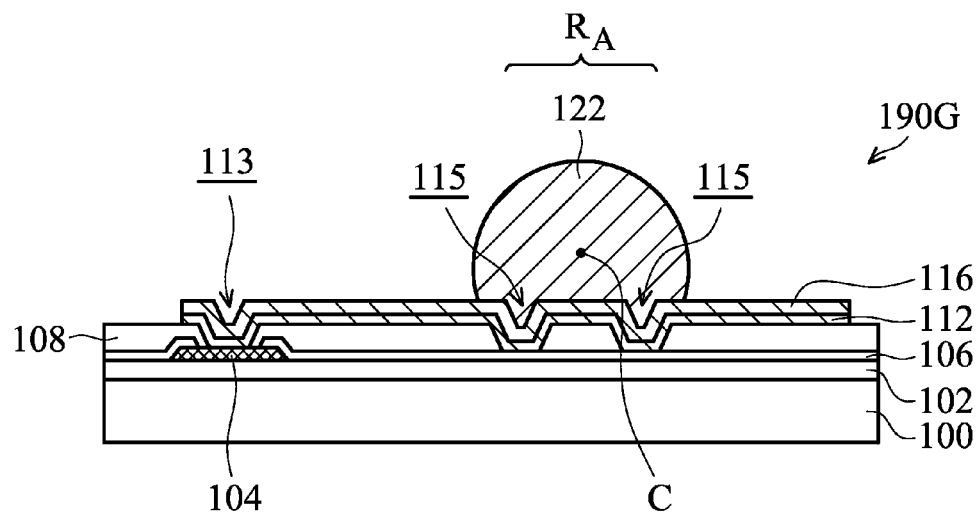
FIGS. 7A and 7B are respectively a cross-sectional view of a semiconductor die and a top view of a conductive layer of the semiconductor die, in accordance with some embodiments.
Figure 7B:
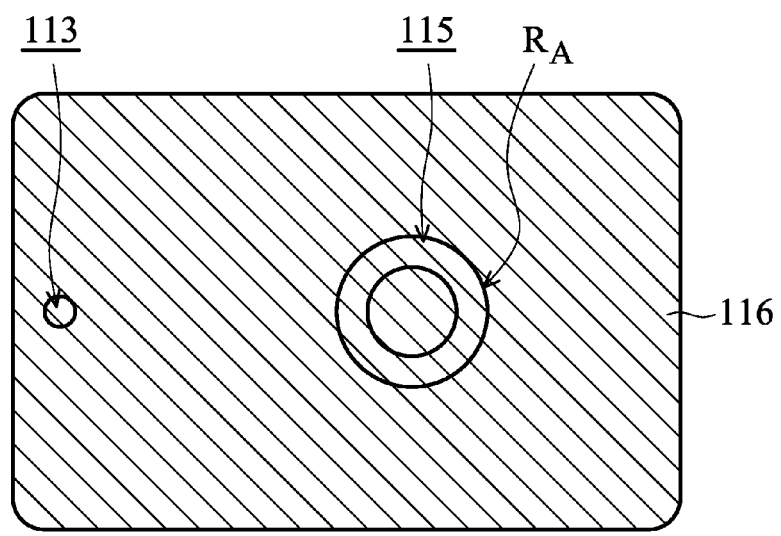

FIGS. 7A and 7B are respectively a cross-sectional view of a semiconductor die 190G and a top view of conductive layer 116 of semiconductor die 190G, in accordance with some embodiments. Similar to the embodiments shown in FIG. 3, conductive layer 116 includes recess 115, which is ring-shaped and defines region $R_A$. In some embodiments, the area of region $R_A$ is smaller than that of region R shown in FIGS. 3, 5B and 6B. In some embodiments, the solder material for forming solder bump 122 completely fills recess 115 and slightly extends across region $R_A$. Therefore, solder bump 122 covers recess 115 and extends on a portion of conductive layer 116, which surrounds recess 115. Solder bump 122 is still substantially confined over region $R_A$. The position and the configuration of solder bump 122 are also precisely controlled.

Figure 8A:
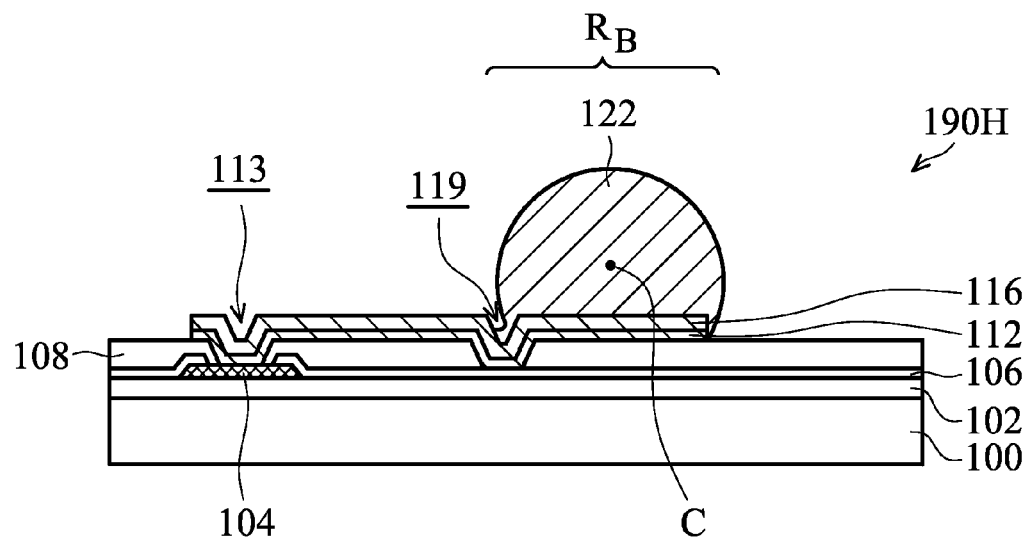
FIGS. 8A and 8B are respectively a cross-sectional view of a semiconductor die and a top view of a conductive layer of the semiconductor die, in accordance with some embodiments.
Figure 8B:
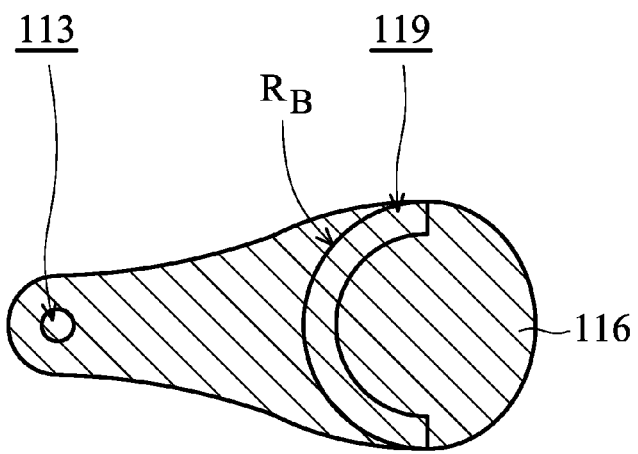

FIGS. 8A and 8B are respectively a cross-sectional view of a semiconductor die 190H and a top view of conductive layer 116 of semiconductor die 190H, in accordance with some embodiments. A recess 119 is formed in conductive layer 116. Recess 119 is not limited to be ring-shaped or to be a circular hole. For example, recess 119 is arc-shaped. In some embodiments, conductive layer 116 of FIGS. 8A and 8B is conductive layer 116 in a corner region N of semiconductor substrate 100 shown in FIG. 1B. Recess 119 define region $R_B$. Recess 119 and an edge of conductive layer 116 together confine the solder material for forming solder bump 122 to be substantially within region $R_B$. The position and the configuration of solder bump 122 are also precisely controlled. In some embodiments, solder bump 122 covers an edge of conductive layer 116, as shown in FIG. 8A.

Figure 9A:
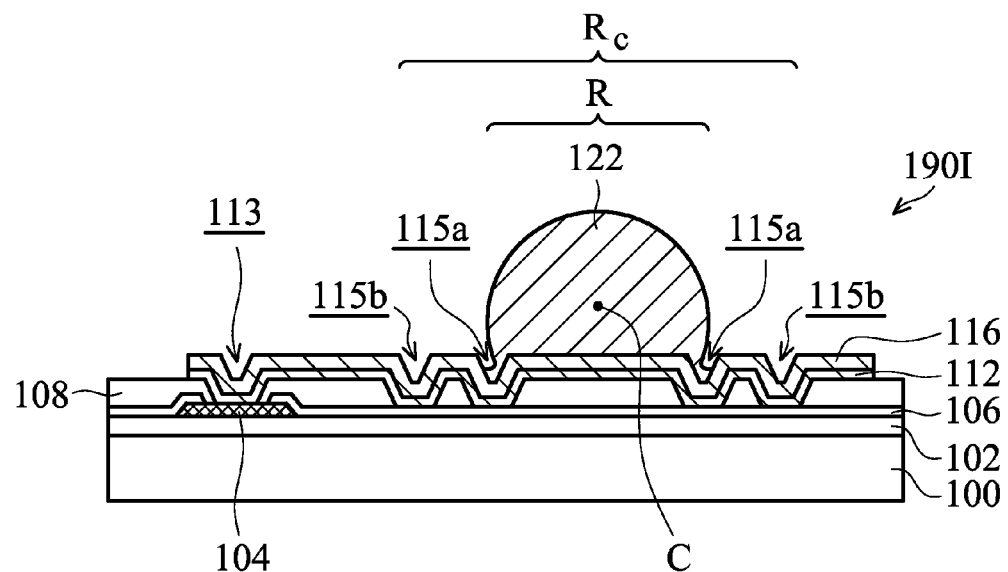
FIGS. 9A and 9B are respectively a cross-sectional view of a semiconductor die and a top view of a conductive layer of the semiconductor die, in accordance with some embodiments.
Figure 9B:
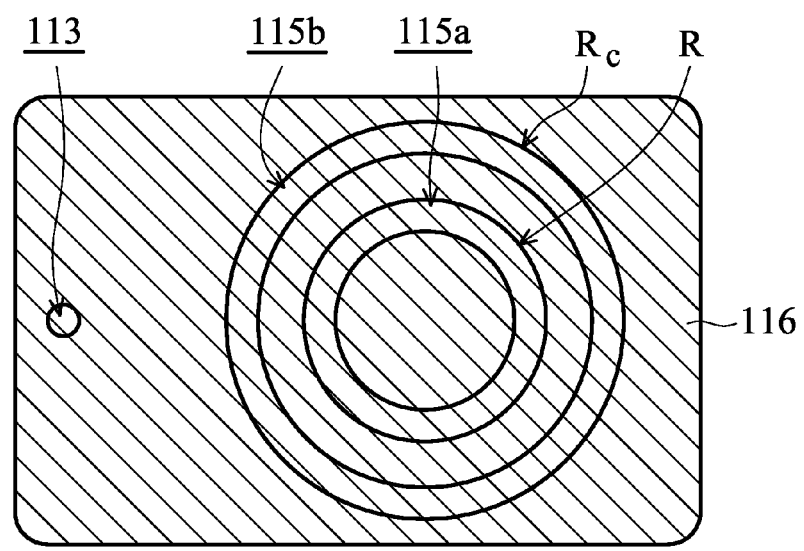

FIGS. 9A and 9B are respectively a cross-sectional view of a semiconductor die 190I and a top view of conductive layer 116 of semiconductor die 190I, in accordance with some embodiments.

As shown in FIGS. 9A and 9B, multiple recesses, including recesses 115a and 115b, are used to confine the position and configuration of solder bump 122. Recesses 115a and 115b may be ring-shaped recesses. The ring-shaped recesses may be circular, square, rectangular, or having other suitable shapes. In some embodiments, the outer edge of recess 115b surrounds region $R_C$ to ensure that solder bump 122 is formed within region $R_C$. The outer edge of recess 115a surrounds region R, which has a smaller area than that of region $R_C$.

As shown in FIG. 9A, solder bump 122 is formed within region R surrounded by recess 115a. Recess 115b is used as a backup to hold the solder material for forming solder bump 122 within region $R_C$. Solder bump 122, located over the desired position and having the desired configuration, is therefore achieved. In some embodiments, central point C of solder bump 122 is right above second passivation layer 108. Second passivation layer 108 provides support to solder bump 122. Semiconductor substrate 100 right under solder bump 122 is therefore protected by second passivation layer 108.

Figure 10A:
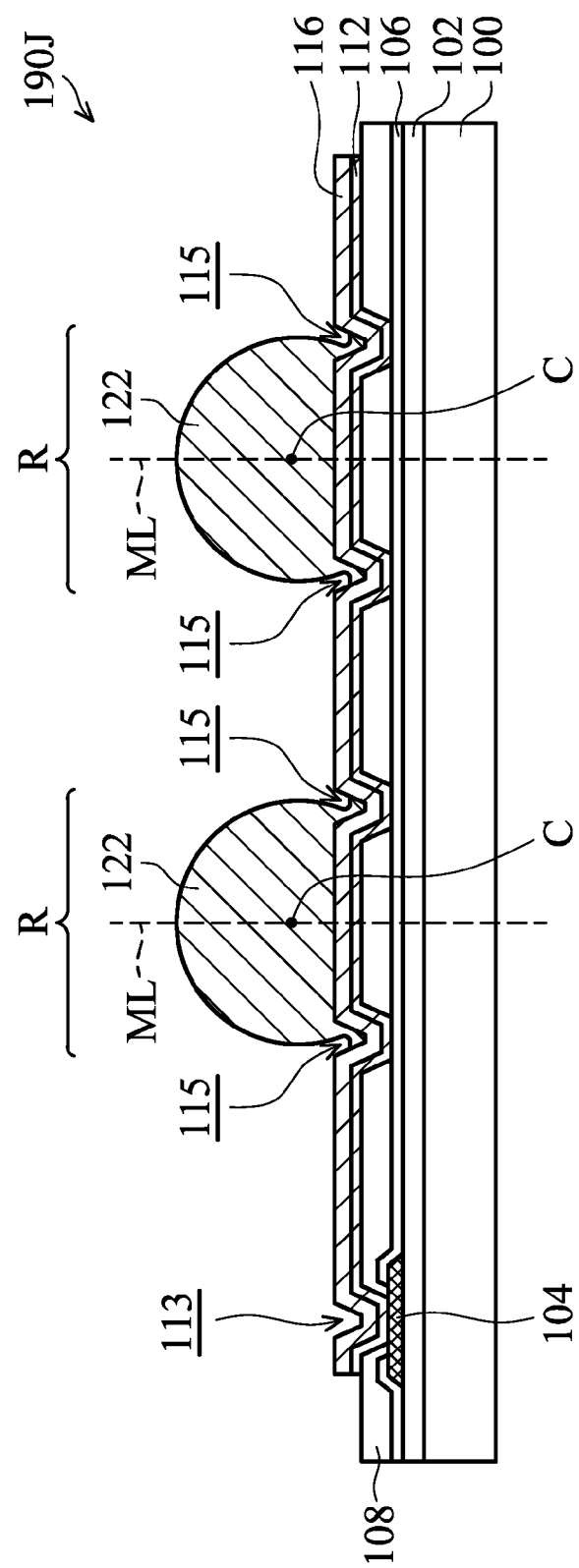
FIGS. 10A and 10B are respectively a cross-sectional view of a semiconductor die and a top view of a conductive layer of the semiconductor die, in accordance with some embodiments.
Figure 10B:
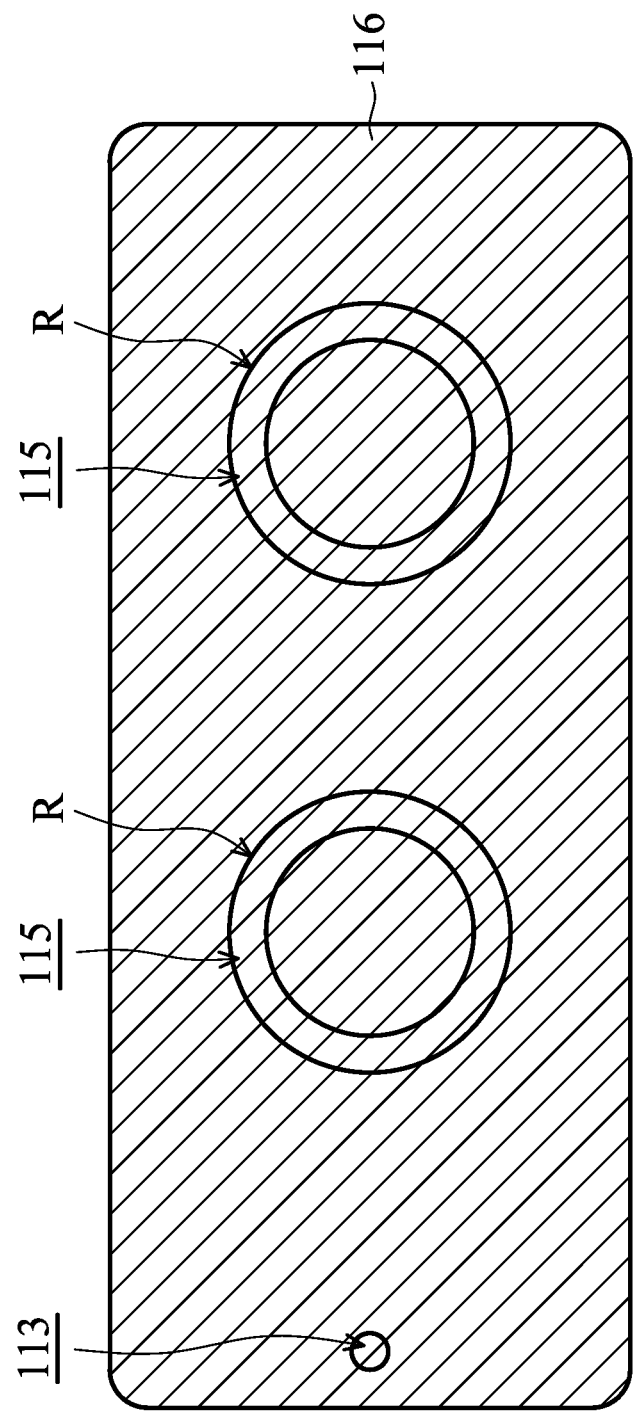

FIGS. 10A and 10B are respectively a cross-sectional view of a semiconductor die 190J and a top view of conductive layer 116 of semiconductor die 190J, in accordance with some embodiments. As shown in FIGS. 10A and 10B, semiconductor die 190J is similar to semiconductor die 190B shown in FIG. 2I, except that semiconductor die 190J has multiple solder bumps 122 adjacent to each other. Conductive layer 116 has multiple recesses 115 respectively under the two solder bumps 122. That is, there are more than one solder bump 122 on conductive layer 116 and confined by recess 115 under solder bump 122.

Figure 11:
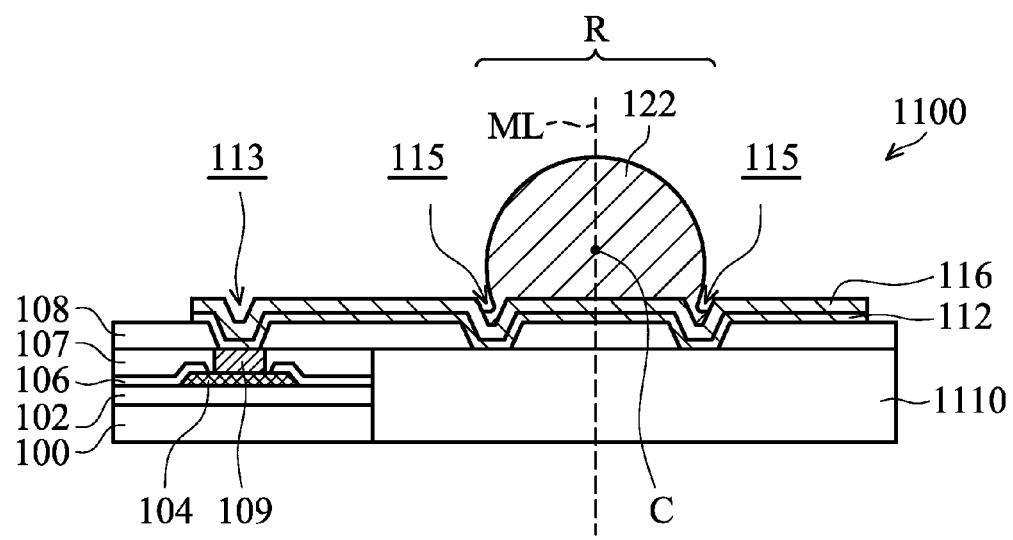
FIG. 11 is a cross-sectional view of a die package, in accordance with some embodiments.

Embodiments of the disclosure are not only used for a fan-in structure but also used for a fan-out structure. FIG. 11 is a cross-sectional view of a die package 1100, in accordance with some embodiments.

As shown in FIG. 11, semiconductor substrate 100 may be mounted in a substrate 1110. Substrate 1110 may be made of molding compound or another applicable material. A passivation layer 107 may be formed between second passivation layer 108 and first passivation layer 106. A conductive element 109 may be formed between contact pad 104 and seed layer 112. Second passivation layer 108 and conductive layer 116 may extend over substrate 1110. Conductive layer 116 may also have recess 115. Therefore, solder bump 122 is confined to be substantially over region R surrounded by recess 115. The position and the configuration of solder bump 122 are also precisely controlled.

It should be noted that, in the above embodiments, solder bump 122 has a width and a height similar to width $W_1$ and height $H_1$ of solder bump 122a of FIG. 1B. The short risk between adjacent bumps is reduced. The yield of bonding the semiconductor die of the above embodiments to another package (or substrate) is improved.

Embodiments of mechanisms for forming a solder bump on a wide conductive layer are provided. Recesses are formed on the edge of the solder bump to confine the solder bump. Various configurations of the recesses can be used. The solder material for forming the solder bump is confined to be within or slightly extend across the recesses. The mechanisms enable the solder bump to have desired width and height. The position and the configuration of the solder bump are therefore precisely controlled. As a result, the yield of bonding the semiconductor die to another substrate or package is therefore greatly improved.

In accordance with some embodiments, a semiconductor die is provided. The semiconductor die includes a semiconductor substrate and a protection layer formed over the semiconductor substrate. The semiconductor die also includes a conductive layer conformally formed over the protection layer, and a recess is formed in the conductive layer. The recess surrounds a region of the conductive layer. The semiconductor die further includes a solder bump formed over the region of the conductive layer surrounded by the recess.

In accordance with some embodiments, a semiconductor die is provided. The semiconductor die includes a semiconductor substrate and a protection layer formed over the semiconductor substrate. The semiconductor die also includes a conductive layer conformally formed over the protection layer, and recesses are formed in the conductive layer. The recesses surround a region of the conductive layer. The semiconductor die further includes a solder bump formed over the region of the conductive layer surrounded by the recesses.

In accordance with some embodiments, a semiconductor die is provided. The semiconductor die includes a semiconductor substrate and a protection layer formed over the semiconductor substrate. The semiconductor die also includes a conductive layer conformally formed over the protection layer, and a first recess and a second recess are formed in the conductive layer. The first recess surrounds a first region of the conductive layer, and the second recess surrounds a second region of the conductive layer. The semiconductor die further includes a first solder bump formed over the first region of the conductive layer surrounded by the first recess. In addition, the semiconductor die includes a second solder bump formed over the second region of the conductive layer surrounded by the second recess.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A semiconductor die, comprising:
    a semiconductor substrate;
    a protection layer formed over the semiconductor substrate;
    a conductive layer conformally formed over the protection layer, wherein a recess is formed in the conductive layer, and the recess surrounds a region of the conductive layer; and
    a solder bump formed over the region of the conductive layer surrounded by the recess, wherein the conductive layer is wider than the solder bump.

2. The semiconductor die as claimed in claim 1, wherein the recess is a ring-shaped recess.

3. The semiconductor die as claimed in claim 1, wherein the recess is completely filled with the solder bump, and the solder bump extends across the region of the conductive layer.

4. The semiconductor die as claimed in claim 1, wherein a portion of the solder bump extends into the recess.

5. The semiconductor die as claimed in claim 1, wherein the recess is an arc-shaped recess.

6. The semiconductor die as claimed in claim 1, wherein the protection layer is between the semiconductor substrate and a central point of the solder bump along a vertical line penetrating through the central point.

7. The semiconductor die as claimed in claim 1, wherein the conductive layer is conformally formed over a recess opening of the protection layer.

8. The semiconductor die as claimed in claim 1, wherein the protection layer and the conductive layer extend over a subtrate, and the solder bump is positioned over the susbtrate.

9. The semiconductor die as claimed in claim 1, further comprising a second solder bump formed over the conductive layer and adjacent to the solder bump.

10. The semiconductor die as claimed in claim 1, wherein a ratio of a width of the recess to a diameter of the region is in a range from about 1.6% to about 40%.

11. The semiconductor die as claimed in claim 1, wherein the conductive layer has raised structures at edges of the recess.

12. The semiconductor die as claimed in claim 1, wherein the entire bottom surface of the solder bump is in direct contact with the conductive layer.

13. A semiconductor die, comprising:
a semiconductor substrate;
a protection layer formed over the semiconductor substrate;
a conductive layer conformally formed over the protection layer, wherein a plurlaity of recesses are formed in the conductive layer, and the recesses surround a region of the conductive layer; and
a solder bump formed over the region of the conductive layer surrounded by the recesses, wherein the conductive layer is wider than the solder bump.

14. The semiconductor die as claimed in claim 13, wherein the recesses comprise a first recess and a second recess, the first recess and the second recess are ring-shaped, and the first recess is surrounded by the second recess.

15. The semiconductor die as claimed in claim 14, wherein the solder bump completely fills the first recess and extends into the second recess.

16. The semiconductor die as claimed in claim 13, wherein the recesses are arc-shaped.

17. The semiconductor die as claimed in claim 16, wherein the recesses comprises a first recess, a second recess, a third recess and a fourth recess, and the first recess and the second recess is surround by the third recess and the fourth recess.

18. The semiconductor die as claimed in claim 17, wherein the first recess is adjacent to a first space between the third recess and the fourth recess, and the second recess is adjacent to a second space between the third recess and the fourth recess.

19. A semiconductor die, comprising:
a semiconductor substrate;
a protection layer formed over the semiconductor substrate;
a conductive layer conformally formed over the protection layer, wherein a first recess and a second recess are formed in the conductive layer, the first recess surrounds a first region of the conductive layer, and the second recess surrounds a second region of the conductive layer;
a first solder bump formed over the first region of the conductive layer surrounded by the first recess; and
a second solder bump formed over the second region of the conductive layer surrounded by the second recess.

20. The semiconductor die as claimed in claim 19, wherein the sizes and shapes of the first solder bump and the second solder bump are substantially the same.

* * * * *